United States Patent [19]
Khoini-Poorfard

[11] Patent Number: 6,151,613
[45] Date of Patent: Nov. 21, 2000

[54] DIGITAL FILTER AND METHOD FOR A MASH DELTA-SIGMA MODULATOR

[75] Inventor: Ramin Khoini-Poorfard, Allentown, Pa.

[73] Assignee: Lucent Technologies Inc., Murray Hill, N.J.

[21] Appl. No.: 09/172,376

[22] Filed: Oct. 14, 1998

[51] Int. Cl.[7] .............................. G06F 17/17; G06F 17/10
[52] U.S. Cl. ............................................ 708/313; 708/316
[58] Field of Search ..................................... 708/313, 316; 341/143

[56] References Cited

U.S. PATENT DOCUMENTS

| | | |
|---|---|---|
| 5,181,033 | 1/1993 | Yassa et al. |
| 5,696,708 | 12/1997 | Leung. |
| 5,949,361 | 7/1999 | Fischer et al. ........................ 341/143 |
| 6,028,544 | 2/2000 | Zarubinsky et al. .................. 341/143 |

*Primary Examiner*—Tan V. Mai
*Attorney, Agent, or Firm*—Ian M. Hughes; Steve Mendelsohn

[57] ABSTRACT

A digital filter receives signals from each stage of a MASH delta-sigma modulator and filters noise components from the signals prior to combination as a single sequence of values decimation. Each stage of the MASH delta-sigma modulator provides an output sequence of one-bit, binary values, which are then filtered to remove high-order, out of band quantization noise. After filtering, the output sequences are then combined through a cascade-combiner, which may be similar to the pre-processing stage of a MASH delta-sigma modulator architecture. The digital filter processes signals of each stage separately. Consequently, the digital filter does not perform multiplication of two, multi-bit values. Multiplication of two values, the first of which is a one-bit, binary value, may be implemented with a multiplexer selecting either the second value or a zero value based on the first one-bit, binary value (i.e., logic 1 or 0, respectively). Duplicate FIR filters, or a single FIR filter with bit-interleaving by a multiplexer, master-slave delay chain and demultiplexer controlled by system clock transitions, may be used to process the sequences on a single bit basis, replacing multi-bit multipliers of the digital filter with multiplexers. Alternatively, the FIR filter may be implemented with a multiplexer, master-slave delay chain, ROM look-up table and demultiplexer if bit interleaving is employed.

26 Claims, 6 Drawing Sheets

DIGITAL FILTER AND METHOD FOR A MASH DELTA-SIGMA MODULATOR

BACKGROUND OF THE INVENTION

1. Field of the Invention

The present invention relates to a digital filter architecture, and, more particularly, to a digital filter with single-bit multipliers in a MASH delta-sigma modulator.

2. Description of the Related Art

Many current applications employ digital sampling of analog signals with over-sampling. For example, analog-to-digital (AID) converters may typically employ an over-sampling architecture. Over-sampling is usually performed at a rate faster than conventional A/D converters by a factor of $2^R$, R an integer greater than 1. A/D converters, or other applications, employing over-sampling generate a large number of samples adding semi-redundant information for subsequent processing. Semi-redundant information may allow for better recovery of a base signal from a quantized signal. Consequently, digital decimation may be utilized to decrease the rate of samples. For digital decimation, two processing steps occur on the oversampled input sequence x[n] at sample rate $f_s$. First, the input sequence is filtered to remove out-of-band noise. Second, the filtered sequence is downsampled in a decimator from the high sample rate $f_s$ to a downsampled rate off $f_s/M$, where M is the decimation factor that usually equivalent to $2^R$.

Analog signals are first processed by an analog modulator, which may be a delta-sigma modulator. While the delta-sigma modulator operates over the baseband, the delta-sigma modulator adds significant quantization noise outside of the baseband. The filtering step is utilized to filter out this quantization noise, and noise shaping is employed prior to filtering to improve performance. Noise shaping operates on the quantization noise of the oversampled sequence, which may be white, Gaussian noise, and reduces quantization noise power in the frequency band of the desired signal by moving the noise power to bands outside. Therefore, filtering by the delta-sigma modulator usually consists of, for example, a high-pass filtering of the added quantization noise signal (noise shaping), followed by, for example, low-pass filtering of the quantization noise signal (noise filtering). Other types of filtering operations on the quantization noise may occur, such as in, for example, band-pass delta-sigma modulators.

One type of delta-sigma modulator employs a MASH architecture. The MASH architecture uses at least two stages, each stage including a low-order, noise-shaping filter and a bit-quantizer (i.e., a comparator). The output sequences of the stages are combined so that the low-order filters operate in cascade to provide a high-order noise-shaping filter (i.e., an N-order noise-shaping filter, N an integer greater than 1). The order of the noise-shaping filter in the MASH delta-sigma modulator may typically be the sum of the orders of the lower-order, noise-shaping stages. Such MASH delta-sigma modulator may commonly be a two-stage delta-sigma modulator having a first stage including a first- or second-order noise-shaping filter and a second stage including a first- or second-order noise-shaping filter. For each order (i.e., high-pass) filter, noise shaping typically transforms the white (flat) noise spectrum of the added quantization noise to a spectrum having a ramp (i.e., positive) noise spectrum, typically on the order of 20 dB per decade. Consequently, third order noise shaping provides, for example, a 60 dB per decade noise-shaped quantization noise spectrum. The digital filter following the noise shaping stages may operate as a low pass infinite impulse response (IIR) filter. The IIR filter desirably has a filter order at least one order higher than the nose-shaping filter (i.e., −80 dB per decade). The digital filter is typically implemented as a Finite Impulse Response (FIR) filter approximating the frequency response of the IIR filter since the FIR filter provides a linear or flat delay response (constant group delay).

A MASH delta-sigma modulator 100 of the prior art is shown in FIG. 1 and includes cascaded filter sections 101, preprocessing stage 106, digital filter 120, which is a conventional FIR filter, and decimator 130. The MASH delta-sigma modulator 100 also typically includes cascaded filter sections 101, each section providing first and/or second order noise-shaping and one-bit quantization of the received input sequence x[n]. As shown in FIG. 1, MASH delta-sigma modulator 100 is a two-stage MASH delta-sigma modulator comprising first noise-shaping stage 102 and second noise-shaping stage 104. Since MASH delta-sigma modulator 100 includes cascaded filter sections, pre-processing stage 106 combines the output signals $y_1[n]$ and $y_2[n]$ of the first and second noise-shaping stages 102 and 104 so as to remove lower order, noise-shaped components of the quantization noise signal, leaving an output sequence $y_F[n]$ representing the signal with only higher-order noise-shaped components. Digital filter 120 may be a FIR filter having K-taps (K an integer) each of the K-taps representing the filter coefficients. Decimator 130 downsamples the filtered sequence of the digital filter 120 by a decimate-by-M operation on the sequence provided by digital filter 120.

An implementation of the two-stage, MASH delta-sigma modulator 100 is shown in FIG. 2. First noise-shaping stage 102 includes two integration feedback loops 220 and 222, respectively, followed by bit-quantizer 224. Second noise-shaping stage 104 includes a single integration feedback loop 230, followed by bit-quantizer 232. Each bit-quantizer 224 and 232 is a one-bit quantizer operating on the filtered input signal x[n].

First noise-shaping stage 102 receives an input sequence x[n] and provides first output sequence $y_1[n]$. The single integration feedback loop 230 of the second noise-shaping stage 104 receives the second order (filtered) output of integration feedback loop 222 of the first noise-shaping stage and provides a second output sequence $y_2[n]$. Values of the first and second output sequences $y_1[n]$ and $y_2[n]$ are each single bit, binary values (logic "1" or "0") provided by the bit-quantizers 224 and 232, respectively.

As would be apparent to one skilled in the art, first noise-shaping stage 102, as shown in FIG. 2, includes a second-order, noise-shaping (second-order, high-pass) filter and the second noise-shaping stage 104 includes a first-order noise-shaping (first-order, high-pass) filter. A two-stage MASH delta-sigma modulator may be implemented with a variety of noise-shaping filter stages. For example, two first-order noise-shaping filters or two second-order noise-shaping filters may be employed. However, noise-shaping filters providing the baseband signal with an out-of-band noise component noise-shaped above the fourth order are typically not preferred since circuits having higher-order filter loops in cascade are either unstable or conditionally stable. For many applications, an FIR filter for digital filter 120 operates on the baseband signal having a third-order, noise-shaped quantization noise signal.

As shown in FIG. 2, the first noise-shaping stage 102 provides a second order noise component in the output value $y_1[n]$. Since the second noise-shaping stage 104 receives the second-order filtered sequence from integration feedback loop 222, the output sequence $y_2[n]$ of the bit-quantizer 232 includes both a first order (noise-shaped) quantization noise component and a third order (noise-shaped) quantization noise component. Consequently, pre-processing stage 106 removes these first- and second-order quantization noise components from the combined first and second output sequences $y_1[n]$ and $y_2[n]$, leaving only the third order quantization noise component in the sequence $y_F[n]$, provided to digital filter 120.

The combining operation of the pre-processing stage 106 is shown in FIG. 2 for the two-stage, third-order MASH delta-sigma modulator. As would be apparent to one skilled in the art, the first output sequence $y_1[n]$ is subject to a first order differentiation in operator 259, and the second output sequence $y_2[n]$ is first multiplied by four (for normalizing purposes) in gain multiplier 260 and the first noise component subtracted in combiner 261 using the differentiated first output sequence $y_1[n]$. The remainder of the second output sequence $y_2[n]$ is then processed with both a first and second order differentiation operator 262 leaving a sequence having only first and third order quantization noise components. The differentiated first output sequence $y_1[n]$ is then also used to subtract the remaining first-order quantization noise component in combiner 263 that provides $y_F[n]$ with only a third-order quantization noise component.

The pre-processing stage 106 of the prior art receives and combines the two, one-bit binary values provided by the first and second noise-shaping sections 102 and 104. Since each value of the output sequence $y_F[n]$ of pre-processing stage 106 has at least four possible values, at least two bits must be employed to represent each value of $y_F[n]$. The FIR digital filter 120 must then apply each of the coefficients to the multi-bit values of $y_F[n]$. This application by FIR digital filter 120 results in a multi-bit multiplication of the value of $y_F[n]$ with the taps (coefficients) of FIR filter 108. Since the input to the FIR filter 108 has several values, the exemplary FIR digital filter 120 must include a chain of multi-bit delays 250 and multipliers 251 capable of multiplying multi-bit values. An exemplary K-tap FIR filter having tap coefficients $T_1$ through $T_K$ for digital filter 120 of the prior art is shown in FIG. 2.

A MASH architecture for a delta-sigma modulator has a benefit of unconditional stability. Consequently, monitoring of the circuit for stability may be eliminated, and the circuit may be easily reset if an unusual event should occur. A disadvantage to this architecture, however, is that sequences of multi-bit values are presented to the digital filter removing quantization noise. Multi-bit multipliers are typically costly in terms of integrated circuit area and implementation complexity.

SUMMARY OF THE INVENTION

The present invention relates to a digital filter for filtering noise-shaped signals of, for example, noise shaping stages of a MASH delta-sigma modulator. The noise-shaping stages each provide an output sequence of one-bit values that are separately filtered to remove, for example, high-order, out of band quantization noise. After filtering, the output sequences are then combined to form a filtered-output sequence. In one embodiment, noise-shaping of the digital signal generates at least two noise-shaped sequences of one-bit values. For each noise-shaped sequence, specific ones of a set of K tap values of a K-tap digital filter are selected based on the bit values of the noise-shaped sequence, and the selected K tap values are combined to provide a filtered sequence. Each filtered sequence is then combined in a cascade-combiner to generate the filtered-output sequence.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 3:
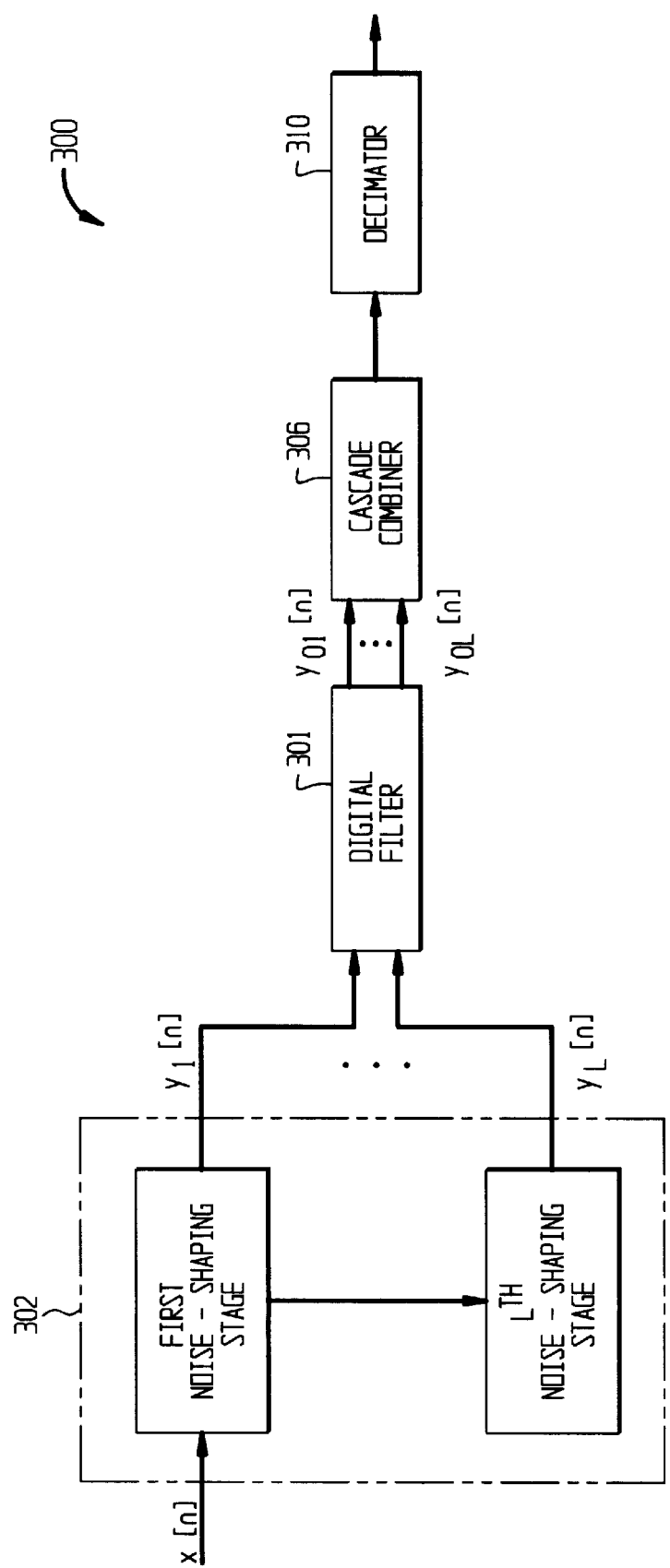
FIG. 3 shows a MASH delta-sigma modulator including a digital filter in accordance with the present invention.

A MASH delta-sigma modulator 300 employing a digital filter in accordance with an exemplary embodiment of the present invention is shown in FIG. 3. Digital filter 301 receives noise-shaped sequences $y_1[n]$ through $y_L[n]$, each having one-bit (i.e., binary) values, from the noise-shaping stages 302 of a MASH delta-sigma modulator 300. The digital filter 301 provides noise-filtered sequences $y_{O1}[n]$ through $y_{OL}[n]$ for combination and low-order noise component removal by cascade-combiner 306. The combined output sequence $y_O[n]$ is then downsampled by decimator 310 with a decimate-by-M operation (M an integer greater than 0). In accordance with the present invention, filtering of the L noise-shaped sequences $y_1[n]$ through $y_L[n]$ from the noise-shaping stages 302 of MASH delta-sigma modulator 300 is performed on each noise-shaped sequence $y_1[n]$ and $y_2[n]$ separately prior to combination of the two filtered sequences $y_{O1}[n]$ through $y_{OL}[n]$. Consequently, the output sequences $y_1[n]$ through $y_L[n]$ are subject to filtering, such as low-pass filtering, prior to removal of the lower-order (noise-shaped) quantization noise components by cascade-combiner 306.

Figure 1:
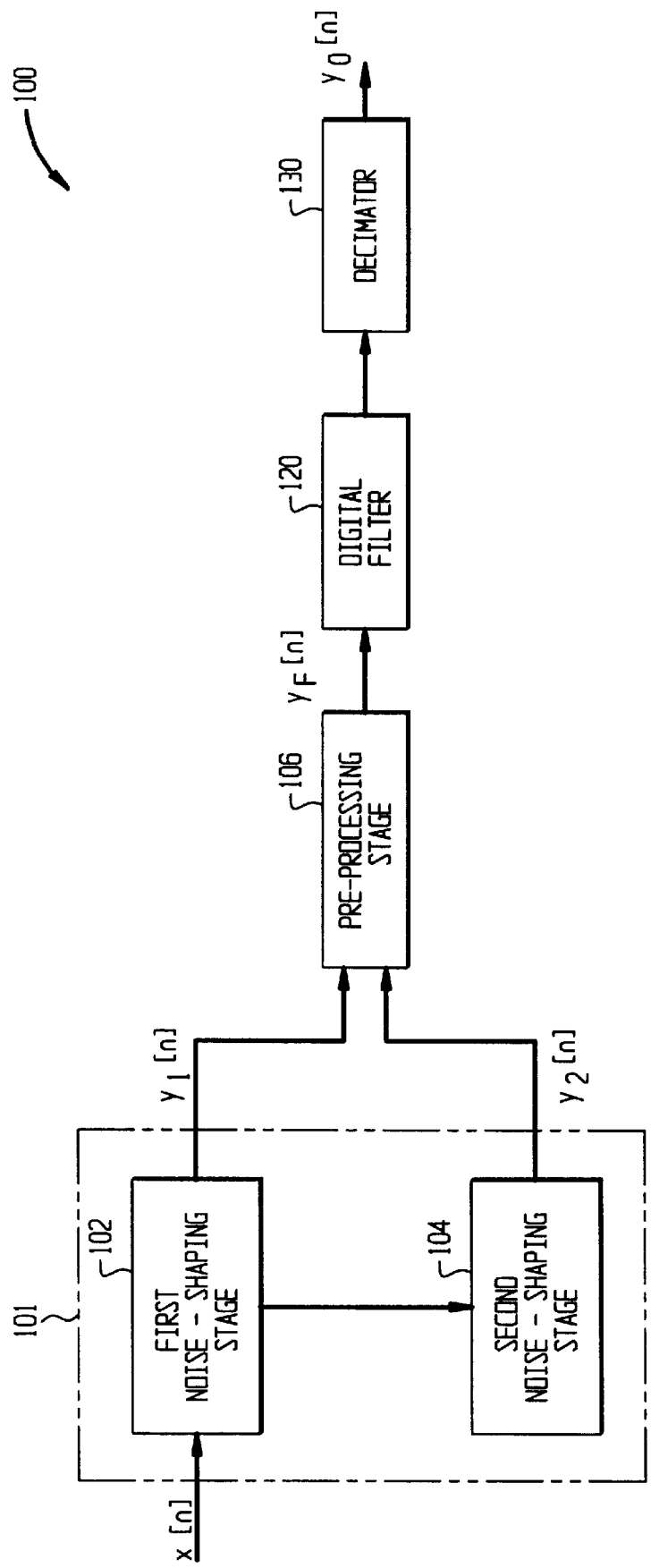
FIG. 1 shows a two-stage, MASH delta-sigma modulator of the prior art including noise-shaping stages, pre-processing stage, FIR filter and decimator.
Figure 2:
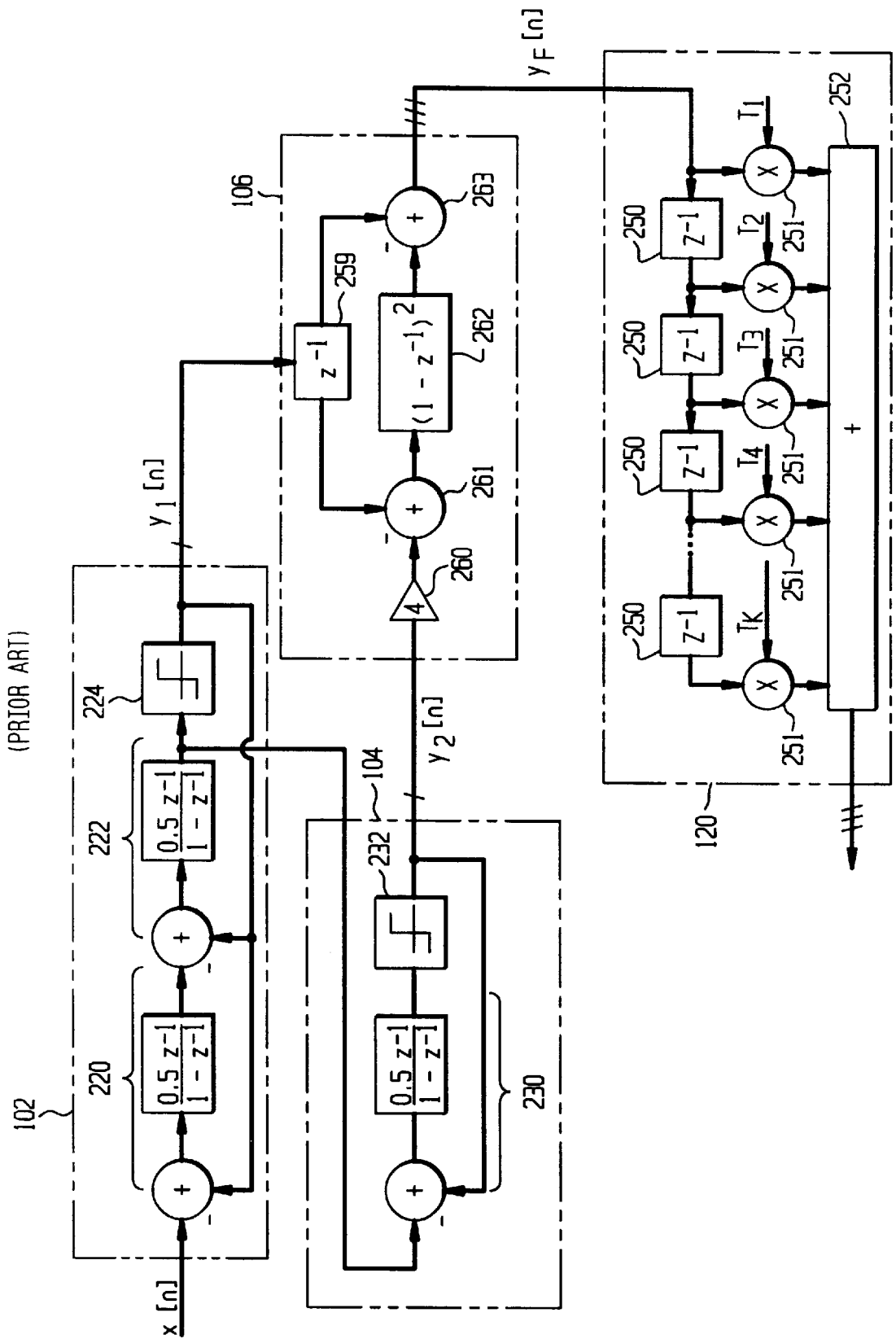
FIG. 2 shows an implementation of the two noise-shaping filter stages, pre-processing stage and FIR filter of the MASH delta-sigma modulator of the prior art.
Figure 4:
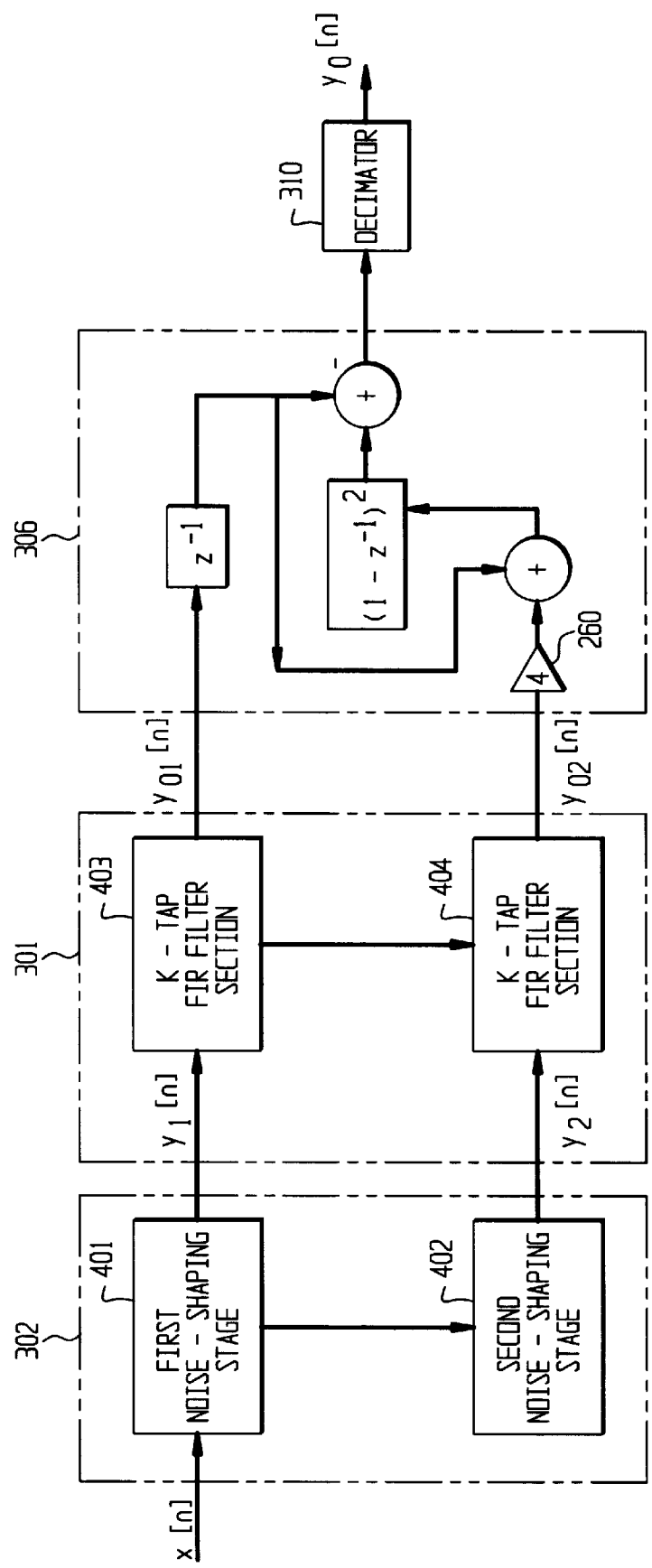
FIG. 4 shows a MASH delta-sigma modulator having an FIR filter as may be employed by the digital filter of FIG. 3.

FIG. 4 illustrates an exemplary embodiment of the digital filter 301 with a K-tap, FIR filter (K an integer) that may be employed in accordance with the present invention. Noise-shaping stages 302 of the MASH delta-sigma modulator are shown for a two-stage, third order MASH delta-sigma modulator including first and second noise-shaping (filter) stages 401 and 402 (i.e., second-order and first-order high-pass filters, respectively). First and second noise-shaping stages 401 and 402 may be implemented and operate as described previously with respect to FIGS. 1 and 2. The cascade-combiner 406 may be implemented and operate as described previously with respect to the pre-processing stage 106 of FIGS. 1 and 2.

As would be apparent to one skilled in the art, any MASH delta-sigma modulator architecture may be employed. In accordance with the present invention, noise-shaping stages provide multiple sequence of one-bit values, each sequence representing a noise-shaped signal, which are then filtered separately to remove high-order, out of band quantization noise. After filtering, the multiple sequences are then combined to remove lower-order noise-shaped signal components, such as through the cascade-combiner of MASH delta-sigma modulator architecture.

As shown in FIG. 4, digital filter 301 may include first and second FIR filter sections 403 and 404. Each of the first and second FIR filter sections 403 and 404 are identical and may also operate in a manner similar to that of FIR digital filter 120 of FIG. 2. Since filtering by each FIR filter 403 and 404 may be on each noise-shaped sequence of binary values $y_1[n]$ or $y_2[n]$, each FIR filter 403 and 404 only combines tap values with single-bit values. Tap values may be multi-bit valued, or may be one-bit, binary-valued tap values.

Consequently, the digital filter 301 of the present invention does not perform multiplication of two, multi-bit values. As is known in the art, multiplying two values, the first of which is a one-bit, binary value, may be implemented with a multiplexer (MUX) selecting either the second value or a zero value based on the first one-bit, binary value (i.e., logic 1 or 0, respectively). The multiplication is simplified further if both values to be multiplied are one-bit, binary values, since only a single-bit multiplier MUX circuit is required (the difference being in register size required for the result). Employing MUX circuits as multipliers is desirable since MUXs are implemented in an integrated circuit (IC) with little IC area and minimal complexity.

Figure 5:
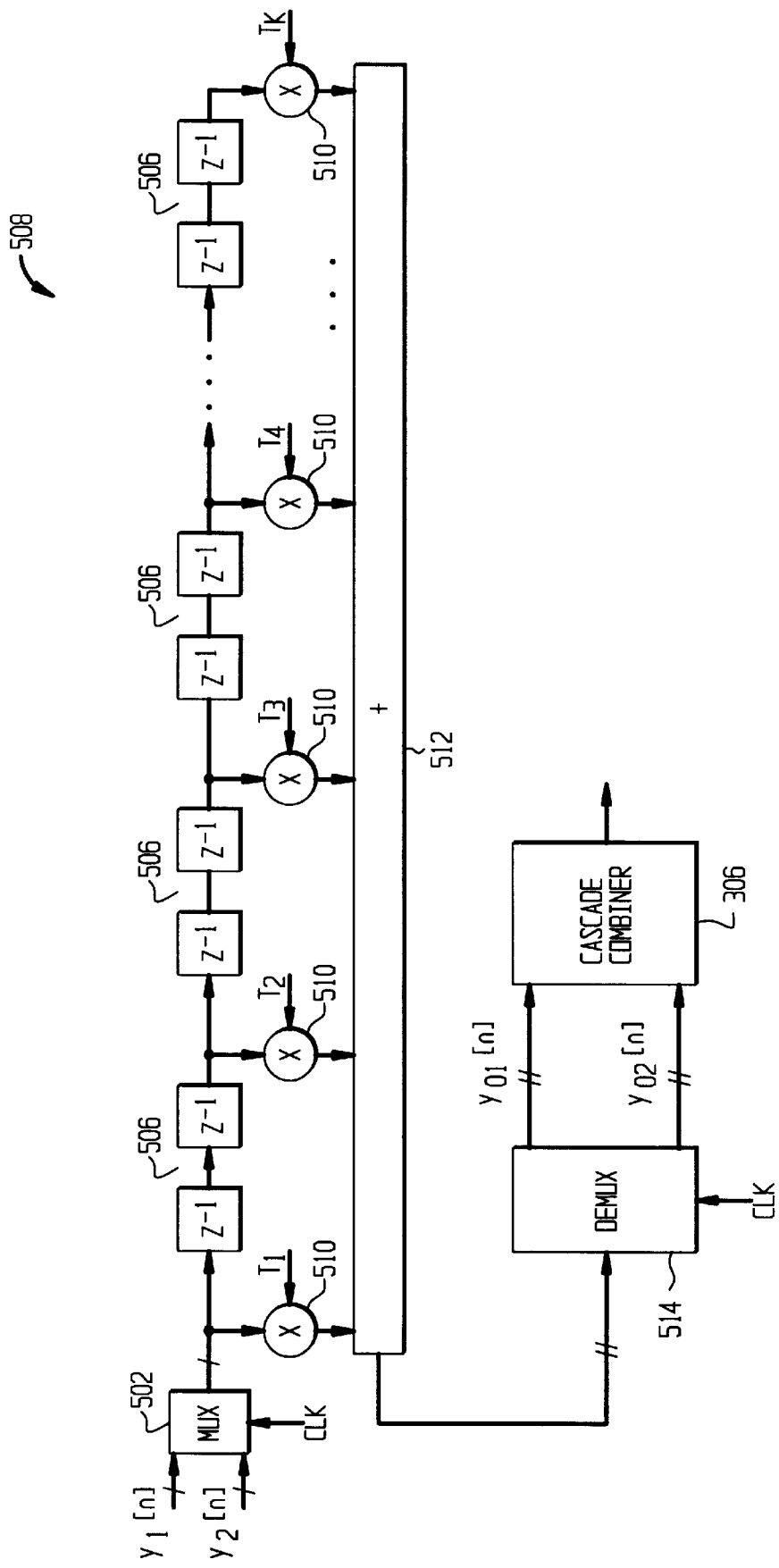
FIG. 5 shows an alternative embodiment of the FIR filter of FIG. 4 employing time interleaving of input sequences.

In accordance with another embodiment of the present invention, since FIR filters sections 403 and 404 of FIG. 4 are identical, digital filter 301 may utilize time interleaving of bits of the noise-shaped sequences $y_1[n]$ through $y_2[n]$ so that only single FIR filter circuit is actually employed. FIG. 5 illustrates an alternative embodiment for the digital filter which employs time interleaving of binary values from first and second noise-shaped sequences $y_1[n]$ and $y_2[n]$ so as to employ a single FIR filter 508 having K-taps $T_1$ through $T_K$ (filter coefficients). The filter coefficients of FIR filter 508, may be identical to the filter coefficients of either one of FIR filters sections 403 and 404 of FIG. 4.

As shown in FIG. 5, noise-shaped sequences $y_1[n]$ and $y_2[n]$ are each provided to MUX 502 which alternatively selects the binary values of the sequences $y_1[n]$ and $y_2[n]$ based on, for example, positive and negative transitions of the system clock signal CLK so as to provide bit-interleaving for FIR filter 508. As shown, FIR filter 508 is modified for interleaving so as to have a delay chain of master-slave delays 506 providing bit values to a tap circuit having bit multipliers 510 and multi-bit adder 512. Each of the master-slave delays 506 includes a master delay 520 and one or more slave delays 521. The number of delays included in master-slave delays 506 may be equivalent to the number of noise-shaped sequences.

Each successive transition of the clock signal CLK causes each master delay 520 of the master-slave delays 506 to alternatively apply bit values of noise-shaped sequences $y_1[n]$ and $y_2[n]$ to bit multipliers 510. Bit multipliers 510 (MUXs) each "multiply" the bit by a corresponding tap value $T_k$, the one-bit (binary) value of each sequence $y_1[n]$ and $y_2[n]$ either selecting for example, the tap value or a zero value. Output values of bit multipliers 510 are then collected in multi-bit adder 512 to provide a bit of a corresponding output sequence $y_{O1}[n]$ and $y_{O2}[n]$. The successive output bits of the multi-bit adder 512 are then provided to demultiplexer (DEMUX) 514. DEMUX 514 provides separate, filtered sequences $y_{O1}[n]$ and $y_{O2}[n]$ corresponding to each of the sequences $y_1[n]$ and $y_2[n]$ in accordance with transitions of the clock signal CLK.

Typical implementations of K-tap, FIR filters may have up to 256 taps. Consequently, the coefficients and the output of FIR filter 508, and FIR filters sections 403 and 404 of FIG. 4) may be 12 to 14 bits wide. Furthermore, the cascade-combiner 306 as shown in FIG. 4 may only include a gain multiplier 260 performing multiplication by two or by four, which multiplication may be implemented by left shifts of one or two, respectively, of a register. Hence, a MASH delta-sigma modulator architecture employing a digital filter in accordance with the present invention may exhibit hardware savings in a number of required multipliers and may translate into a considerable hardware savings in a typical implementation. Furthermore, a double frequency clock signal is not required with respect to the system clock because first and second phases of the system clock signal may be allowed to ripple binary data through master-slave delays 506 of FIG. 5.

Figure 6:
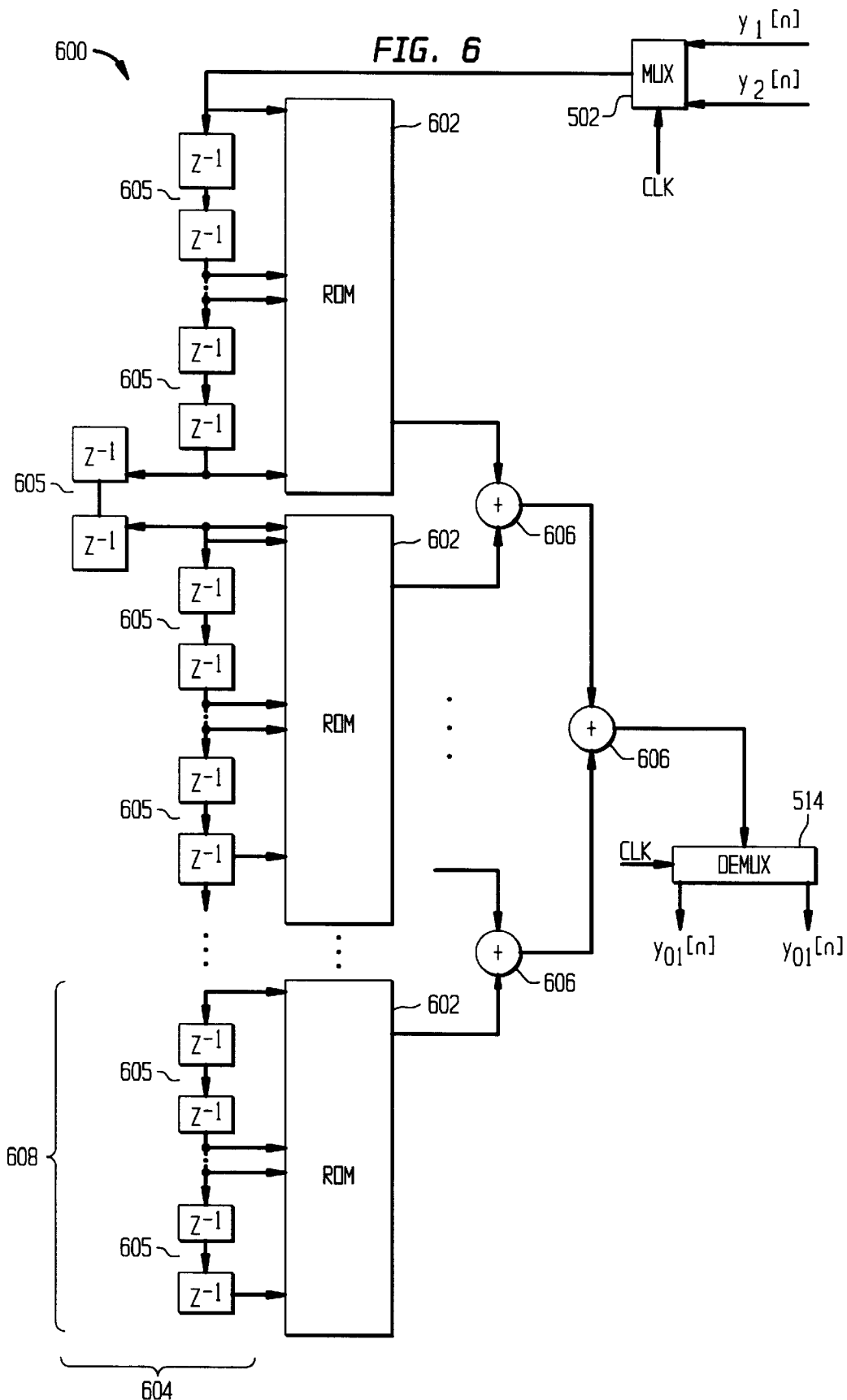
FIG. 6 shows an alternative embodiment of the FIR filter of FIG. 4 in accordance with the present invention employing time interleaving of input sequences and a ROM look-up table.

FIG. 6 shows an alternative embodiment of the tap circuit of FIR filter 508 for the digital filter 301. As shown in FIG. 6, the K-tap FIR filter 600 includes at least one ROM memory 602, delay chain 604 including master-slave delays 605, and up to ((K/m)−1) adders 606, m an integer greater than 0. In the alternative embodiment of FIR filter 508 shown in FIG. 6, the delay chain 604 may have a delay subsection 608 for each ROM memory 602. Each of the delay subsections 608 may have m master-slave delays 605. Each ROM 602 includes m-bit address lines and contains $2^m$ entries, with each entry of ROM 602 being, for example, 12 to 14 bits wide. Each m-bit address line is associated with one of the K-tap values. Each entry of the ROM 602 corresponds to the combined tap values selected by values of the m-bit address lines.

For the FIR filter 600 of FIG. 6, the MUX 502 alternatively selects the binary values of noise-shaped sequences $y_1[n]$ and $y_2[n]$ based on, for example, positive and negative transitions of the system clock CLK so as to provide bit-interleaving for FIR filter 600. The one-bit values of each sequence $y_1[n]$ and $y_2[n]$ are, therefore, alternately applied to the ROM 602 as the values of the m-bit address lines. This FIR filter architecture has (K/m) ROM memories 602, and the output of each ROM memory 602 is added to produce the final output sequence value using ((K/m)−1) adders 606, which are multi-bit adders. The output of the adders 606 is provided to DEMUX 514. DEMUX 514 provides separate, filtered sequences $y_{O1}[n]$ and $y_{O2}[n]$ corresponding to each of the sequences $y_1[n]$ and $y_2[n]$ in accordance with transitions of the clock signal CLK.

Although the exemplary embodiments of FIGS. 4, 5, and 6 are shown and described performing digital filtering on two noise-shaped sequences $y_1[n]$ and $y_2[n]$ of noise-shaping stages of a MASH delta-sigma modulator, the present invention is not so limited. As would be apparent to one skilled in the art, the digital filter may be modified to operate on three or more noise-shaped sequences provided by noise-shaping stages. For example, in FIG. 4, an additional FIR filter section may be added for each additional sequence. Further, if bit-interleaving is employed, the FIR filters 508 and 600 of FIG. 5 and FIG. 6, respectively, may have an additional delay inserted into each master-slave delay pair for each additional noise-shaped sequence.

While the exemplary embodiments of the present invention have been described with respect to processes of circuits, the present invention is not so limited. As would be apparent to one skilled in the art, various functions of circuit elements may also be implemented in the digital domain as processing steps in a software program. Such software may be employed in, for example, a digital signal processor, micro-controller or general-purpose computer.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A circuit having a digital filter for filtering a digital signal comprising a noise-shaping filter adapted to filter the digital signal to provide at least two noise-shaped sequences of one-bit values;

a multi-tap digital filter having K-taps, K being an integer greater than 2, the multi-tap filter adapted to combine, for each noise-shaped sequence, selected ones of the tap values based on bit values of the noise-shaped sequence to provide a corresponding filtered sequence; and a cascade combiner adapted to combine the filtered sequences to generate a filtered-output sequence.

2. The invention as recited in claim 1, wherein the K-tap digital filter comprises a filter section for each stage and having a plurality of taps, each filter section providing a corresponding filtered sequence.

3. The invention as recited in claim 1, wherein the K-tap digital filter comprises:

a multiplexer coupled to receive each noise-shaped sequence and adapted to alternately provide bits of each noise-shaped sequence based on a clock signal;

a delay chain coupled to the mux and having a plurality of one-bit delays, wherein the plurality of one-bit delays are coupled in series as at least one master-slave delay set, each master-slave delay set having a master delay and at least one slave delay, a number of delays in the master-slave delay set being equivalent to a number of noise-shaped sequences, and the alternately provided bits of each noise-shaped sequence are sequentially clocked through the delay chain based on a clock signal;

a tap circuit adapted to form a bit of each filtered sequence based on the clock signal, wherein the output bit of the master delay in each master-slave delay set selects a corresponding tap value, the selected tap values combined to form a combined filter tap value for the bit of each filtered sequence; and a demultiplexer adapted to alternately receive bits of each filtered sequence based on the clock signal and to provide the alternately received bits as the filtered-output sequence.

4. The invention as recited in claim 3, wherein the tap circuit comprises a plurality of single-bit multipliers, each single bit multiplier receiving a bit from a corresponding master delay and a corresponding tap value, and each single bit multiplier providing either the tap value or the bit value as an output value based on the bit; and a combiner adapted to combine each value provided by the plurality of single-bit multipliers to form the combined filter-tap value.

5. The invention as recited in claim 4, wherein each single bit multiplier is a multiplexer selecting either the tap value or a zero based on the bit.

6. The invention as recited in claim 3, wherein the tap circuit comprises a memory storing an array of combined filter tap values, the memory adapted to provide one of the combined tap values equivalent to a combination of the selected tap values based on the bit of each master delay.

7. The invention as recited in claim 6, wherein each bit provided by each master delay forms a memory address, and the memory provides the one of the combined tap values corresponding to the memory address.

8. The invention as recited in claim 6, wherein the tap circuit comprises:

at least two memories, each memory having a corresponding delay subsection of the delay chain and adapted to 1) store an array of combined filter tap values, and 2) provide a combined filter tap value based on an output bit of each master delay of the corresponding delay subsection; and a combiner, adapted to combine the combined filter tap values to form the bit.

9. The invention as recited in claim 8, wherein each bit provided by each master delay of a corresponding delay subsection forms a memory address, and the memory provides the one of the combined filter tap values corresponding to the memory address.

10. The invention as recited in claim 1, wherein:

the noise-shaping filter is an N-order, noise-shaping filter having at least two stages in cascade, N an integer greater than 1, each stage of the noise-shaping filter adapted to filter a quantization noise component of the digital signal and each of at least two stages including a bit-quantizer to provide a corresponding noise-shaped sequence of one-bit values, and the cascade-combiner is adapted to process one filtered sequence with at least one other filtered sequence to provide the filtered-output sequence, wherein the one filtered sequence has at least one noise-shaped signal component having an order less than N that is attenuated in the filtered-output sequence.

11. The invention as recited in claim 10, further comprising a decimator adapted to downsample the filtered-output sequence by M, M being an integer greater than 0.

12. A method for filtering a digital signal comprising the steps of:

a) noise-shaping the digital signal to generate at least two noise-shaped sequences of one-bit values;

b) selecting, for each noise-shaped sequence, ones of a set of K tap values corresponding to a K-tap digital filter based on the bit values of the noise-shaped sequence;

c) combining, for each noise-shaped sequence, the selected K tap values to provide a filtered sequence; and d) combining, in a cascade-combiner, the filtered sequences to generate a filtered-output sequence.

13. The method as recited in claim 12, wherein, for the selecting step b), tap values are selected from a sub-set of the set of K tap values, each noise-shaped sequence having a corresponding sub-set.

14. The method as recited in claim 12, wherein step b) further comprises the steps of:

b1) alternately providing bits of each noise-shaped sequence based on a clock signal;

b2) clocking the alternately provided bits through a sequence of one-bit delays based on a clock signal, wherein the plurality of one-bit delays are coupled in series as at least one master-slave delay set, each master-slave delay set having a master delay and at least one slave delay, and the number of delays in the master-slave delay set being equivalent to the number of noise-shaped sequences; and b3) selecting a corresponding tap value based on the output bit of the master delay in each master-slave delay set; and wherein the step c) further comprises the steps of:
c1) combining the selected tap values of step b3) to form a combined filter tap value for the bit of each filtered sequence based on the clock signal;
c2) alternately receiving bits of each filtered sequence based on the clock signal; and
c3) providing the alternately received bits as the filtered-output sequence.

15. The method as recited in claim 14, wherein the step b3) comprises the steps of receiving, for each master delay, a bit from the master delay and a corresponding tap value, and providing either the tap value or the bit value as an output value based on the bit.

16. The method as recited in claim 15, wherein step b3) selects either the tap value or a zero based on the bit.

17. The method as recited in claim 14, wherein the step b3) comprises the steps of storing, in at least one memory, an array of combined filter tap values, and providing, from the memory, one of the combined tap values equivalent to a combination of the selected tap values based on the bit of each master delay.

18. The method as recited in claim 17, wherein step b3 further comprises the steps of forming a memory address from each bit provided by each master delay, and providing the one of the combined tap values corresponding to the memory address.

19. The method as recited in claim 17, wherein step b3 comprises the steps of:
i) storing an array of combined filter tap values in at least two memories, each memory having a corresponding delay subsection of the delay chain;
ii) providing, by each memory, a combined filter tap value based on an output bit of each master delay of the corresponding delay subsection; and
iii) adding the combined filter tap values of each memory to form the bit.

20. The method as recited in claim 19, wherein step b3) further includes the step of forming a memory address with each bit provided by each master delay of a corresponding delay subsection, and the step b3ii) provides the one of the combined filter tap values corresponding to the memory address.

21. The method as recited in claim 12, wherein:
the step a) further comprises the steps of:
a1) noise-shaping the digital signal with an N-order, noise-shaping filter having at least two stages in cascade, N an integer greater than 1;
a2) filtering, by each stage of the noise-shaping filter, a quantization noise component of the digital signal; and
a3) bit-quantizing, by at least two stages, the digital signal filtered in step a2) to provide a corresponding noise-shaped sequence of one-bit values, and
wherein step d) further comprises the step of:
d1) processing one filtered sequence with at least one other filtered sequence to provide the filtered-output sequence, wherein the one filtered sequence has at least one noise-shaped signal component having an order less than N that is attenuated in the filtered-output sequence.

22. The method as recited in claim 21, further comprising the step e) downsampling the filtered-output sequence by M, M being an integer greater than 0.

23. An MASH delta-sigma modulator comprising:
a noise-shaping filter adapted to filter the digital signal to provide at least two noise-shaped sequences of one-bit values;
a K-tap digital filter adapted to combine, for each noise-shaped sequence, selected ones of the tap values based on bit values of the noise-shaped sequence to provide a corresponding filtered sequence; and
a cascade combiner adapted to combine the filtered sequences to generate a filtered-output sequence.

24. The invention as recited in claim 23, wherein:
the noise-shaping filter is an N-order, noise-shaping filter having at least two stages in cascade, N an integer greater than 1, each stage of the noise-shaping filter adapted to filter the digital signal and each of at least two stages including a bit-quantizer to provide a corresponding noise-shaped sequence of one-bit values, and
the cascade-combiner is adapted to process one filtered sequence with at least one other filtered sequence to provide the filtered-output sequence, wherein the one filtered sequence has at least one noise-shaped signal component having an order less than N that is attenuated in the filtered-output sequence.

25. The invention as recited in claim 24, wherein the K-tap digital filter comprises:
a multiplexer coupled to receive each noise-shaped sequence and adapted to alternately provide bits of each noise-shaped sequence based on a clock signal;
a delay chain coupled to the multiplexer and having a plurality of one-bit delays, wherein
the plurality of one-bit delays are coupled in series as at least one master-slave delay set, each master-slave delay set having a master delay and at least one slave delay, a number of delays in the master-slave delay set being equivalent to a number of noise-shaped sequences, and
the alternately provided bits of each noise-shaped sequence are sequentially clocked through the delay chain based on a clock signal;
a tap circuit adapted to form a bit of each filtered sequence based on the clock signal, wherein the output bit of the master delay in each master-slave delay set selects a corresponding tap value, the selected tap values combined to form a combined filter tap value for the bit of each filtered sequence; and
a demultiplexer adapted to alternately receive bits of each filtered sequence based on the clock signal and to provide the alternately received bits as the filtered-output sequence.

26. The invention as recited in claim 24, further comprising a decimator adapted to downsample the filtered-output sequence by M, M being an integer greater than 0.

* * * * *